(12) United States Patent
Chen et al.

(10) Patent No.: US 11,632,110 B2
(45) Date of Patent: Apr. 18, 2023

(54) HIGH SPEED CIRCUIT WITH DRIVER CIRCUIT

(71) Applicant: MEDIATEK INC., Hsinchu (TW)

(72) Inventors: Chun-Chia Chen, Hsinchu (TW);
Yao-Tsung Hsieh, Hsinchu (TW);
Jian-Feng Shiu, Hsinchu (TW);
Chao-An Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/366,386

(22) Filed: Jul. 2, 2021

(65) Prior Publication Data

US 2022/0045680 A1 Feb. 10, 2022

Related U.S. Application Data

(60) Provisional application No. 63/063,441, filed on Aug. 10, 2020.

(51) Int. Cl.
*H03K 19/003* (2006.01)
*H03K 3/356* (2006.01)
(Continued)

(52) U.S. Cl.
CPC . *H03K 19/00315* (2013.01); *H03K 3/356113* (2013.01); *H03K 17/08142* (2013.01); *H03K 19/018507* (2013.01)

(58) Field of Classification Search
CPC ....... H03K 19/00315; H03K 3/356113; H03K 17/08142; H03K 19/018507;
(Continued)

(56) References Cited

U.S. PATENT DOCUMENTS 5,736,869 A * 4/1998 Wei ................. H03K 19/00315
327/543
5,969,542 A * 10/1999 Maley ................ H03K 17/102
326/17
(Continued)

FOREIGN PATENT DOCUMENTS

| CN | 109933120 A | 6/2019 |
| EP | 3 540 737 A1 | 9/2019 |
| TW | 201041301 A | 11/2010 |

OTHER PUBLICATIONS

Extended European Search Report dated Dec. 22, 2021, issued in application No. EP 21187822.8.
(Continued)

*Primary Examiner* — Jason Crawford
(74) *Attorney, Agent, or Firm* — McClure, Qualey & Rodack, LLP

(57) ABSTRACT

A high-speed circuit with a high-voltage (HV) driver circuit. The high-speed circuit has a driver circuit and a level shifter. The driver circuit includes HV components which are operated in an HV domain. The level shifter includes low-voltage (LV) components which are operated in an LV domain. The level shifter translates signals from the LV domain to the HV domain to generate control signals for the driver circuit. The high-speed circuit may include a protection voltage generator converting a power supply voltage and a power ground voltage to generate a first direct-current bias voltage (VBP) and a second direct-current bias voltage (VBN) to bias the LV components of the level shifter. The LV components of the level shifter include input transistors and protection transistors. Gate voltages of the protection transistors may be tied to VBP or VBN.

14 Claims, 5 Drawing Sheets

(51) Int. Cl.
*H03K 17/0814* (2006.01)
*H03K 19/0185* (2006.01)

(58) Field of Classification Search
CPC .... H03K 19/003; H03K 19/01; H03K 19/017; H03K 19/0175; H03K 19/017509; H03K 19/01806; H03K 19/0185; H03K 19/018514; H03K 19/018571; H03K 17/06; G11C 7/1051; G11C 8/08; G11C 7/1078; G11C 5/063; G11C 5/147; G11C 11/4074; G11C 7/10; G11C 7/4074
See application file for complete search history.

(56) References Cited

U.S. PATENT DOCUMENTS

| | | | | |
|---|---|---|---|---|
| 6,556,061 | B1* | 4/2003 | Chen | H03K 3/356113 327/437 |
| 6,642,769 | B1* | 11/2003 | Chang | H03K 3/356147 327/333 |
| 6,801,064 | B1* | 10/2004 | Hunt | H03K 19/018521 327/333 |
| 7,068,074 | B2* | 6/2006 | Bhattacharya | H03K 17/102 326/85 |
| 7,102,410 | B2* | 9/2006 | Khan | H03F 3/45183 327/306 |
| 7,224,195 | B2* | 5/2007 | Pilling | H03K 19/018585 327/112 |
| 7,468,615 | B1* | 12/2008 | Tan | H03K 19/018528 327/333 |
| 7,501,856 | B2* | 3/2009 | Huang | H03K 19/00361 327/333 |
| 7,560,970 | B2* | 7/2009 | Cook | H03K 3/35613 327/333 |
| 7,570,088 | B1* | 8/2009 | Ku | H03K 19/00315 327/112 |
| 7,649,387 | B2* | 1/2010 | Jan | H03K 19/018521 326/82 |
| 7,710,182 | B2* | 5/2010 | Yu | H03K 3/356182 327/333 |
| 7,724,045 | B2* | 5/2010 | Ueno | H03K 5/1515 327/108 |
| 7,768,308 | B2* | 8/2010 | Maede | H03K 3/356113 327/333 |
| 7,808,275 | B1* | 10/2010 | Ansel | H03K 19/018521 326/82 |
| 7,898,295 | B1* | 3/2011 | Kasturirangan | H03K 19/018528 326/86 |
| 7,948,810 | B1 | 5/2011 | Tang et al. | |
| 8,368,425 | B2* | 2/2013 | Huang | H03K 3/356182 327/333 |
| 8,441,301 | B2* | 5/2013 | Duby | H03K 19/018507 326/62 |
| 8,531,227 | B2* | 9/2013 | Kumar | H03K 19/018528 327/333 |
| 8,536,925 | B2* | 9/2013 | Bhattacharya | H03K 3/0375 327/333 |
| 8,547,140 | B1* | 10/2013 | Faucher | H03F 3/2171 326/86 |
| 8,581,628 | B2* | 11/2013 | Yeh | G08C 19/00 326/82 |
| 8,669,803 | B2* | 3/2014 | Huang | H03K 3/356165 365/189.11 |
| 8,981,831 | B1* | 3/2015 | Kossel | H03K 19/018507 327/333 |
| 9,112,511 | B2* | 8/2015 | Lnu | H03L 5/00 |
| 10,141,934 | B2* | 11/2018 | Yang | H01L 27/0207 |
| 10,205,441 | B1* | 2/2019 | Abhishek | H03K 5/003 |
| 11,211,920 | B2* | 12/2021 | Han | H03K 3/356113 |
| 11,277,121 | B1* | 3/2022 | Goyal | H03K 3/356113 |
| 2005/0156631 | A1* | 7/2005 | Huang | H03K 17/102 326/81 |
| 2005/0162191 | A1* | 7/2005 | Vorenkamp | H03K 19/00361 326/88 |
| 2005/0285623 | A1* | 12/2005 | Jahan | H03K 19/00361 326/68 |
| 2006/0091907 | A1* | 5/2006 | Khan | H03K 3/356113 326/81 |
| 2006/0186921 | A1* | 8/2006 | Chen | H03K 19/0016 326/58 |
| 2007/0008001 | A1* | 1/2007 | Sanchez | H03K 3/356113 326/80 |
| 2007/0085566 | A1* | 4/2007 | Koto | H03K 3/356104 326/80 |
| 2007/0152711 | A1* | 7/2007 | Ahn | H03K 19/09429 326/81 |
| 2008/0048736 | A1* | 2/2008 | Ruy | H03F 3/45928 327/108 |
| 2009/0128191 | A1* | 5/2009 | Ku | H03K 19/018571 326/80 |
| 2010/0026343 | A1* | 2/2010 | Yang | H03K 19/01855 326/80 |
| 2010/0214851 | A1* | 8/2010 | Nirschl | G11C 16/24 365/185.23 |
| 2012/0212256 | A1* | 8/2012 | Nicholas | H03K 19/018521 327/309 |
| 2012/0229165 | A1* | 9/2012 | Tseng | H03K 19/00361 326/82 |
| 2014/0232710 | A1* | 8/2014 | Low | H03K 17/693 327/437 |
| 2015/0180474 | A1* | 6/2015 | Mathur | H03K 19/018521 326/81 |
| 2016/0079978 | A1* | 3/2016 | Kinzer | H03K 17/102 326/68 |
| 2016/0373092 | A1* | 12/2016 | Storms | G11C 16/30 |
| 2018/0175860 | A1 | 6/2018 | Koo et al. | |
| 2022/0045680 | A1* | 2/2022 | Chen | H03K 19/00315 |

OTHER PUBLICATIONS

Chinese language office action dated Jan. 21, 2021, issued in application No. TW 110129241.

* cited by examiner

HIGH SPEED CIRCUIT WITH DRIVER CIRCUIT

CROSS REFERENCE TO RELATED APPLICATIONS

This application claims the benefit of U.S. Provisional Application No. 63/063,441 filed Aug. 10, 2020, the entirety of which is incorporated by reference herein.

BACKGROUND OF THE INVENTION

Field of the Invention

The present invention relates to input and output (I/O) design of a high-speed circuit.

Description of the Related Art

High-speed circuits, for implementing a memory, a transmitter, and so on, usually use low-voltage components. The low-voltage components are also named core devices and are operated by the lower voltages (e.g., 0.95V). In comparison with the low-voltage components, high-voltage devices operated by the higher voltages (e.g., 1.2V or 1.5V) are more robust but much slower in operation.

How to design a high-speed but robust circuit is an important topic in this field of technology.

BRIEF SUMMARY OF THE INVENTION

A high-speed circuit with a driver circuit is shown in the present invention. The high-speed circuit has a driver circuit and a level shifter. The driver circuit includes high-voltage components which are operated in a high-voltage domain. The level shifter includes low-voltage components which are operated in a low-voltage domain. The level shifter translates signals from the low-voltage domain to the high-voltage domain to generate control signals for the driver circuit.

Specifically, the high-speed circuit may include a protection voltage generator that converts a power supply voltage and a power ground voltage to a first direct-current bias voltage (VBP) and a second direct-current bias voltage (VBN) to bias the low-voltage components of the level shifter. The protection voltage generator may be an on-chip circuit having input terminals coupled to a power supply terminal and a power ground terminal of the high-speed circuit to receive the power supply voltage and the power ground voltage from a power source outside the high-speed circuit. The first voltage difference is the voltage difference between the power supply voltage and the first direct-current bias voltage (VBP). The second voltage difference is the voltage difference between the second direct-current bias voltage (VBN) and the power ground voltage. The first voltage difference and the second voltage difference are both within the low-voltage domain. The low-voltage components within the level shifter are thereby protected from being damaged.

The low-voltage components of the level shifter may include input transistors and protection transistors. The gates of the protection transistors are coupled to the first direct-current bias voltage (VBP) or the second direct-current bias voltage (VBN). Because the transistor gates do not drain currents, there is no need to design a powerful protection voltage generator to provide the first direct-current bias voltage (VBP) and the second direct-current bias voltage (VBN). In the conventional techniques, additional capacitors outside the high-speed circuit are required to transform the strong power source to the proper level for the low-voltage components, and so that a conventional circuit usually has additional pads (or balls) to be coupled to external capacitors to receive the proper power. In the present invention, however, the external capacitors and the additional pads (or balls) can be eliminated.

In an exemplary embodiment, the gate voltages of the protection transistors are tied to the first direct-current bias voltage (VBP) or the second direct-current bias voltage (VBN).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
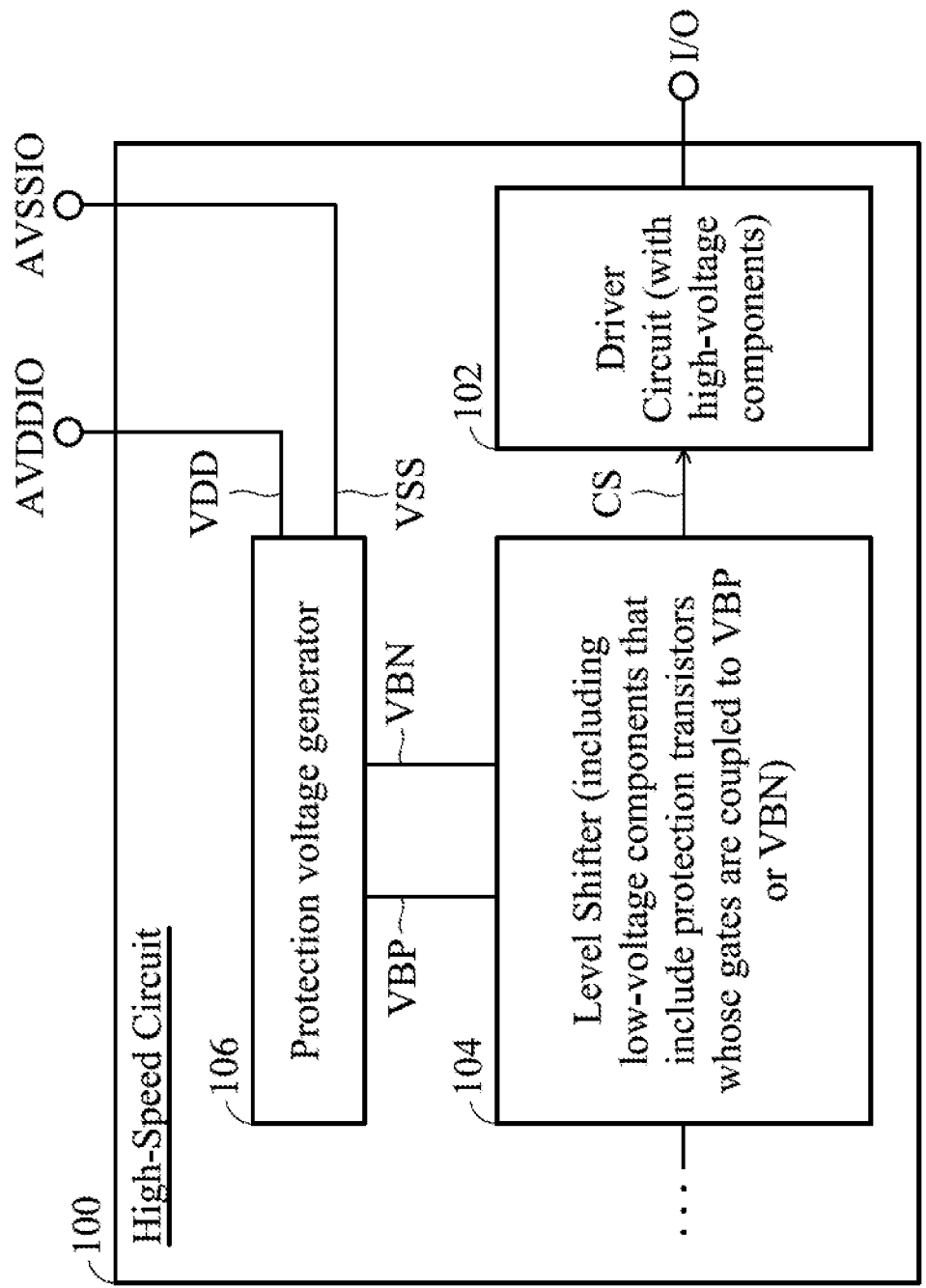
FIG. 1 shows a high-speed circuit 100 with a driver circuit 102 in accordance with an exemplary embodiment of the present invention.

FIG. 1 shows a high-speed circuit 100 with a driver circuit 102 in accordance with an exemplary embodiment of the present invention. In addition to the driver circuit 102, the high-speed circuit 100 has a level shifter 104. The driver circuit 102 includes high-voltage components (e.g., thick-gate transistors) which are operated in a high-voltage domain (e.g., GND~1.2V or GND~1.5V). The level shifter 104 includes low-voltage components (e.g., thin-gate transistors) which are operated in a low-voltage domain (e.g., GND~0.95V). The level shifter 104 translates signals from the low-voltage domain to the high-voltage domain to generate control signals CS for the driver circuit 102.

Specifically, the high-speed circuit 100 may include a protection voltage generator 106 that converts a power supply voltage VDD and a power ground voltage VSS to generate two different direct-current bias voltages VBP and VBN to bias the low-voltage components of the level shifter 104. The protection voltage generator 106 has input terminals coupled to a power supply terminal AVDDIO and a power ground terminal AVSSIO of the high-speed circuit 100 to receive the power supply voltage VDD and the power ground voltage VSS from a power source. The power source may be configured outside of the high-speed circuit 100. In another exemplary embodiment of the present invention, the power source is also configured on the high-speed circuit 100. The first voltage difference (VDD−VBP) is the voltage difference between the power supply voltage VDD and the direct-current bias voltage VBP. The second voltage difference (VBN−VSS) is the voltage difference between the direct-current bias voltage VBN and the power ground voltage VSS. Both the first voltage difference (VDD−VBP) and the second voltage difference (VBN−VSS) are within the low-voltage domain.

In an exemplary embodiment wherein VDD is 1.5V and VSS is 0V, to fall within a low-voltage domain 0V~0.95V, VBP is 0.55V and VBN is 0.95V. In an exemplary embodiment wherein VDD is 1.2V and VSS is 0V, to fall within a low-voltage domain 0V~0.95V, VBP is 0.25V and VBN is 0.95V.

The low-voltage components of the level shifter 104 include input transistors and protection transistors. The gates of the protection transistors are coupled to the direct-current bias voltage VBP or VBN. Because the transistor gates do not drain currents, there is no need to design a powerful protection voltage generator to provide the direct-current bias voltage VBP and VBN. In conventional techniques, additional capacitors are required to transform a strong power source to the proper level for low-voltage components and therefore a conventional high-speed circuit usually requires additional pads (or balls) to be coupled to external capacitors to receive the proper power. In the present invention, however, the external capacitors and the additional pads (or balls) can be eliminated. As shown, the high-speed circuit 100 does not use additional pads (or balls) to receive any exclusive power for the low-voltage components of the high-speed circuit 100.

In some exemplary embodiments, the gate voltages of the protection transistors within the level shifter 104 are tied to the direct-current bias voltage VBP or VBN, but not limited thereto.

In some exemplary embodiments, the protection voltage generator 106 is a low dropout regulator (LDO). The low dropout regulator may include low-voltage components.

Figure 2:
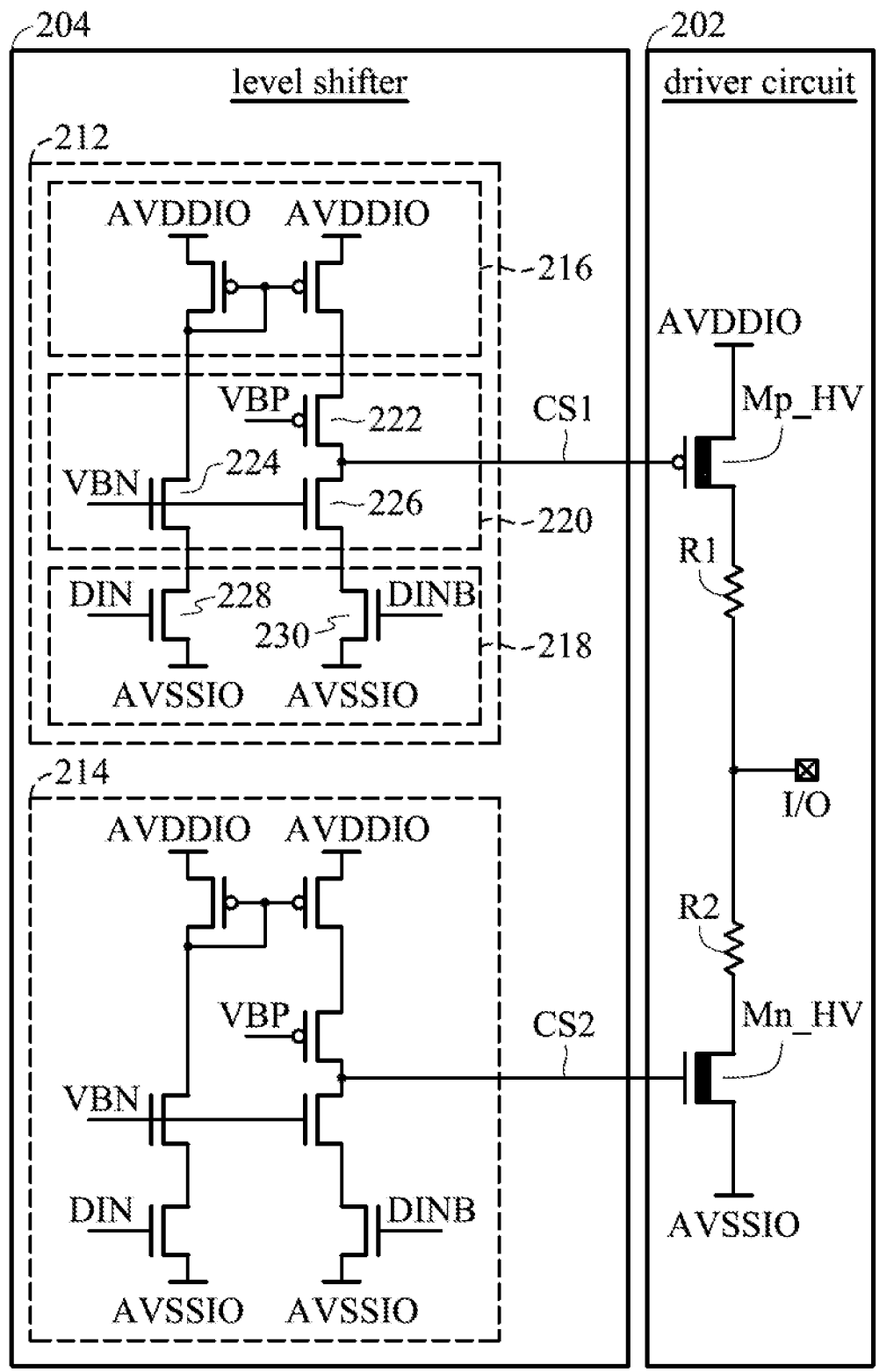
FIG. 2 depicts a driver circuit 202 and a level shifter 204 in accordance with an exemplary embodiment of the present invention.

FIG. 2 depicts a driver circuit 202 and a level shifter 204 in accordance with an exemplary embodiment of the present invention. The driver circuit 202 includes a high-voltage p-channel transistor (e.g., a thick-gate PMOS) Mp_HV, resistors R1 and R2, and a high-voltage n-channel transistor (e.g., a thick-gate NMOS) Mn_HV, which are connected in series between the power supply terminal AVDDIO and the power ground terminal AVSSIO. The power supply terminal AVDDIO is connected to the source terminal of the high-voltage p-channel transistor Mp_HV, the drain terminal of the high-voltage p-channel transistor Mp_HV is connected to the drain terminal of the high-voltage n-channel transistor Mn_HV via the resistors R1 and R2, and a source terminal of the high-voltage n-channel transistor Mn_HV is connected to the power ground terminal AVSSIO. A connection terminal between the resistors R1 and R2 is an output terminal (I/O) of the driver circuit 202. Control signals CS1 and CS2 generated by the level shifter 204 are coupled to the gate of the high-voltage p-channel transistor Mp_HV and the gate of the high-voltage n-channel transistor Mn_HV, respectively.

The level shifter 204 includes sub-circuits 212 and 214 which output the control signals CS1 and CS2, respectively. The sub-circuits 212 and 214 may be identical circuits but not limited thereto.

As shown in the sub-circuit 212, each sub-circuit includes a low-voltage current mirror (e.g., formed by thin-gate transistors) 216, a low-voltage input pair (e.g., formed by thin-gate transistors to receive a differential signal pair DIN and DINB from the former stage) 218, and a low-voltage protection circuit (e.g., formed by thin-gate transistors) 220. The low-voltage current mirror 216 is coupled to the power supply terminal AVDDIO. The low-voltage protection circuit 220 is coupled between the low-voltage current mirror 216 and the low-voltage input pair 218, and uses protection transistors whose gates are biased by the direct-current bias voltage VBP or VBN. The control signal CS1 is retrieved from a connection terminal between an output terminal of the low-voltage current mirror 216 and the low-voltage protection circuit 220. Or, in the example of FIG. 2, the control signal CS1 is retrieved from the connection terminal between the low-voltage p-channel transistor 222 and the low-voltage n-channel transistor 226. The control signal CS2 may be provided in the similar way.

As shown, the low-voltage protection circuit 220 includes a low-voltage p-channel transistor (e.g., a thin-gate PMOS) 222, and two low-voltage n-channel transistors (e.g., two thin-gate NMOSs) 224 and 226. The low-voltage current mirror 216 has a first terminal coupled to the drain terminal of the low-voltage n-channel transistor 224 and a second terminal (i.e., the output terminal of the low-voltage current mirror 216) coupled to the source terminal of the low-voltage p-channel transistor 222. The source terminal of the low-voltage n-channel transistor 224 is coupled to the drain terminal of the positive transistor 228 of the low-voltage input pair 218. The low-voltage n-channel transistor 226 has a drain terminal coupled to the drain terminal of the low-voltage p-channel transistor 222, and has a source terminal coupled to the drain terminal of the negative transistor 230 of the low-voltage input pair 218. The gate of the low-voltage p-channel transistor 222 is coupled to the direct-current bias voltage VBP. The gates of the low-voltage n-channel transistors 224 and 226 are coupled to the direct-current bias voltage VBN. The control signal CS1 is retrieved from the connection terminal between the low-voltage p-channel transistor 222 and the low-voltage n-channel transistor 226. The control signal CS2 may be provided in the similar way.

Figure 3:
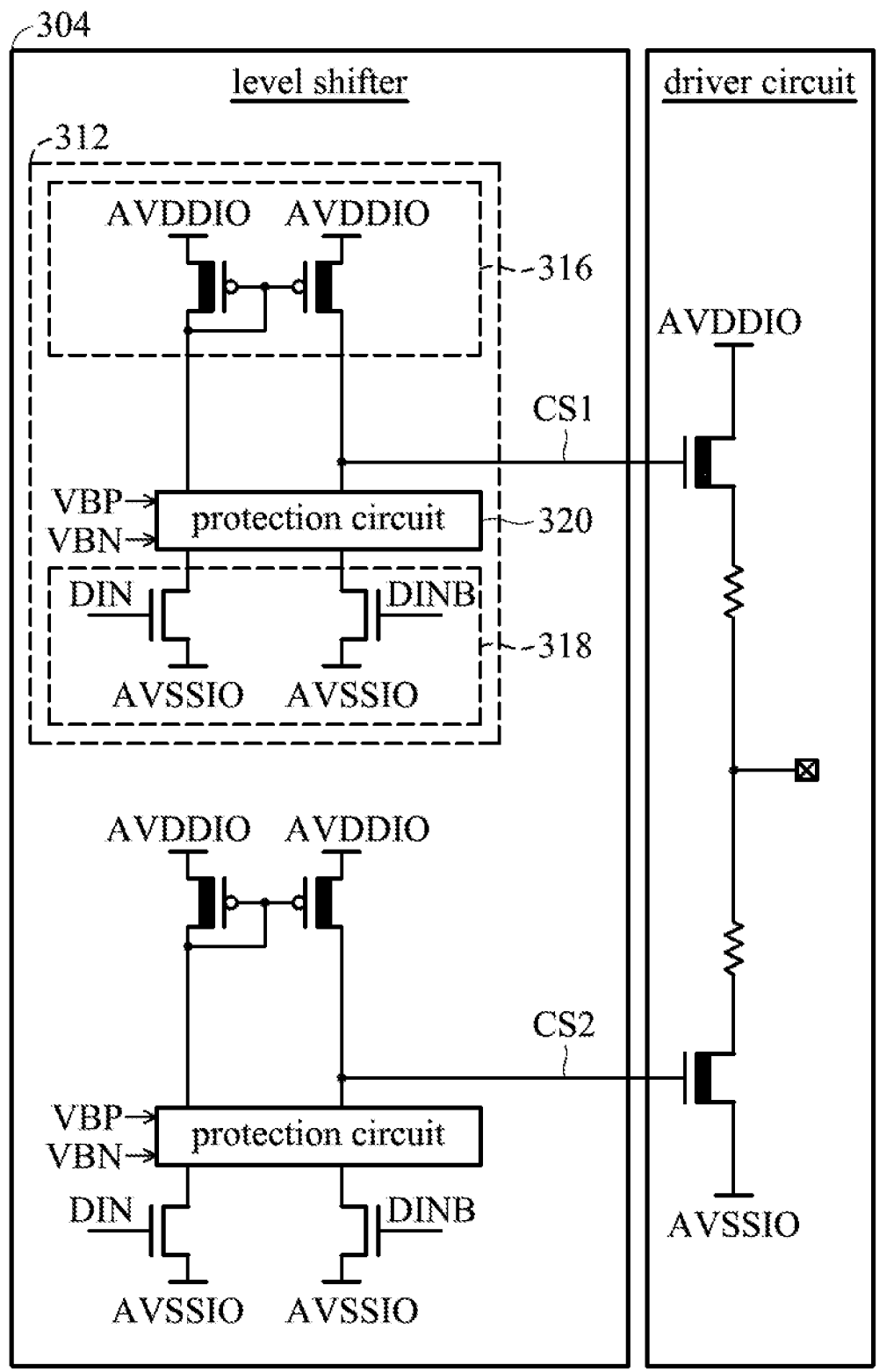
FIG. 3 depicts a level shifter 304 in accordance with an exemplary embodiment of the present invention.

FIG. 3 depicts a level shifter 304 in accordance with another exemplary embodiment of the present invention. Each sub-circuit (referring to 312) includes a high-voltage current mirror 316 (e.g., formed by thick-gate transistors), a low-voltage input pair 318, and a low-voltage protection circuit 320. The high-voltage current mirror 316 is coupled to the power supply terminal AVDDIO. The low-voltage protection circuit 320 uses low-voltage protection transistors (e.g., thin-gate transistors) biased by the direct-current bias voltage VBP (and/or VBN) and is coupled between the high-voltage current mirror 316 and the low-voltage input pair 318. The control signal CS1 is retrieved from a connection terminal between an output terminal of the high-voltage current mirror 316 and the low-voltage protection circuit 320. The control signal CS2 may be provided in the similar way.

Figure 4:
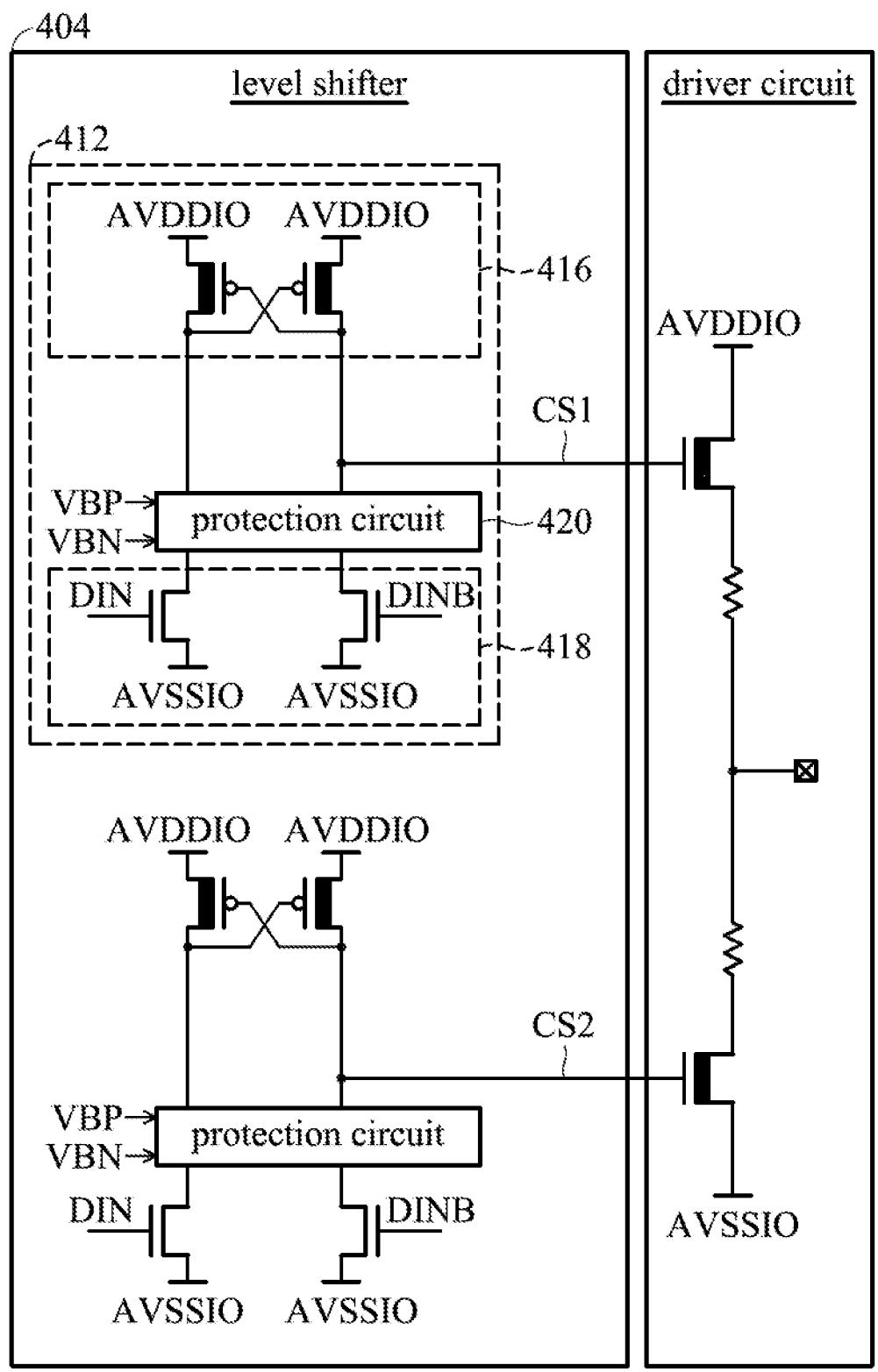
FIG. 4 depicts a level shifter 404 in accordance with another exemplary embodiment of the present invention.

FIG. 4 depicts a level shifter 404 in accordance with another exemplary embodiment of the present invention. Each sub-circuit (referring to 412) includes a high-voltage cross-coupled pair (e.g., formed by thick gate transistors) 416, a low-voltage input pair 418, and a low-voltage protection circuit 420. The high-voltage cross-coupled pair 416 is coupled to the power supply terminal AVDDIO. The low-voltage protection circuit 420 uses low-voltage protection transistors (e.g., thin-gate transistors) biased by the direct-current bias voltage VBP (and/or VBN), and is coupled between the high-voltage cross-coupled pair 416 and the low-voltage input pair 418. The control signal CS1 is retrieved from a connection terminal between an output terminal of the high-voltage cross-coupled pair 416 and the low-voltage protection circuit 420. The control signal CS2 may be provided in the similar way.

In another exemplary embodiment, the high-voltage cross-coupled pair 416 may be replaced by low-voltage cross-coupled pair which is formed by thin-gate transistors.

In some exemplary embodiments, there may be a pre-driver coupled between the level shifter and the driver circuit.

Figure 5:
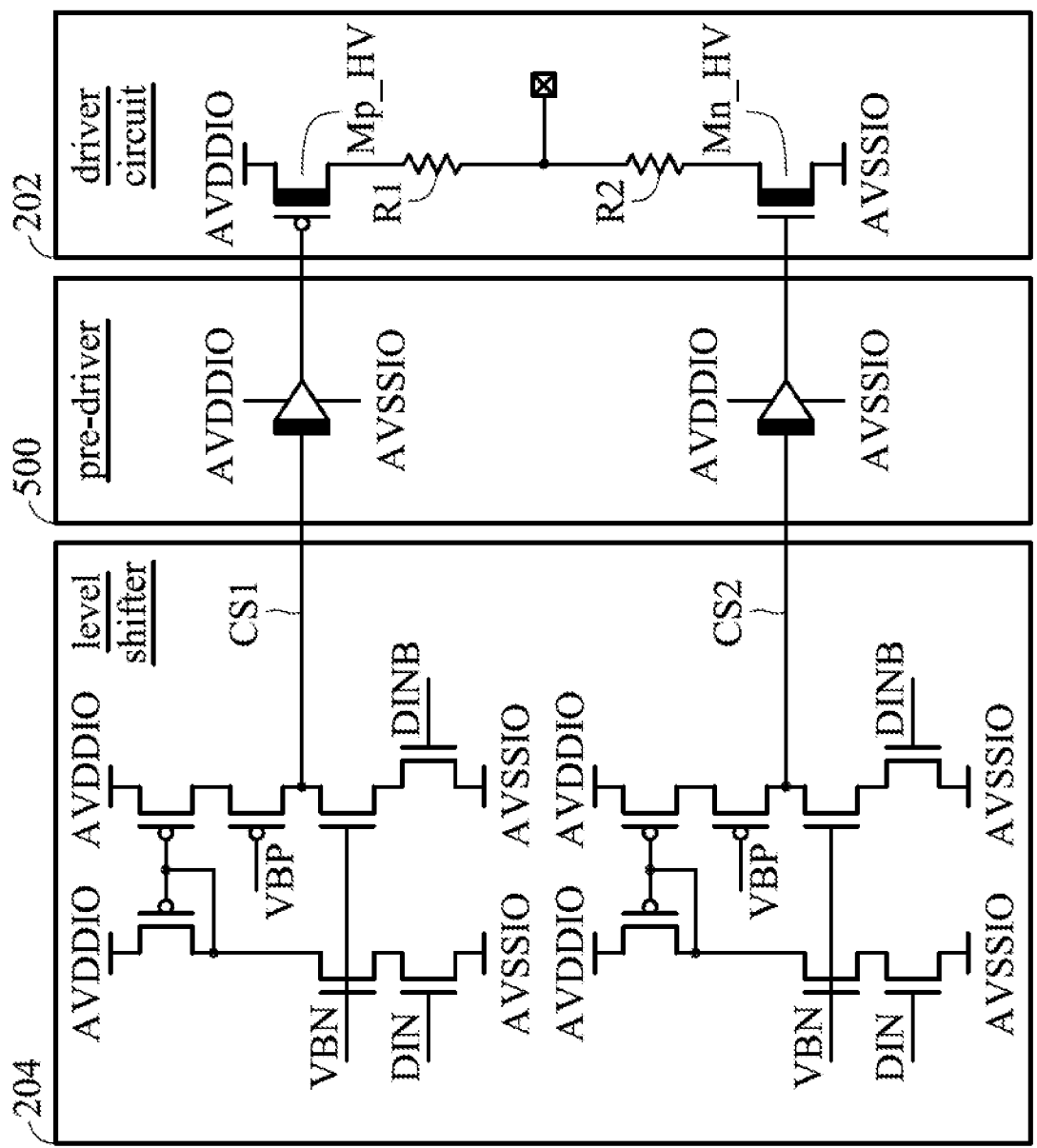
FIG. 5 depicts a pre-driver 500 in accordance with an exemplary embodiment of the present invention.

FIG. 5 depicts a pre-driver 500 in accordance with an exemplary embodiment of the present invention. The pre-driver 500 includes high-voltage components (e.g., power amplifiers formed by thick-gate transistors) and has power terminals coupled to the power supply terminal AVDDIO and the power ground terminal AVSSIO. Through the pre-driver 500, the control signals CS1 and CS2 generated by the level shifter 204 are coupled to the gate of the high-voltage p-channel transistor Mp_HV and the gate of the high-voltage n-channel transistor Mn_HV, respectively.

The aforementioned high-speed circuit may be implemented as a high-speed chip, which has the aforementioned high-voltage driver circuit that may operate with a memory chip. The robust driver circuit can drive an input and output (I/O) pin of the high-speed chip that is coupled to the memory chip.

The aforementioned high-speed circuit with a driver circuit may be a transmitter circuit. The robust driver circuit drives an output pin of the transmitter circuit.

In another exemplary embodiment, the high-speed circuit 100 may be designed to drive a memory module (e.g., a DDR3 or DDR4 SDRAM).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-speed circuit, comprising:
    a driver circuit, including high-voltage components with thick gates which are operated in a high-voltage domain; and
    a level shifter, including low-voltage components with thin gates which are operated in a low-voltage domain, wherein the level shifter translates signals from the low-voltage domain to the high-voltage domain to generate control signals for the driver circuit;
    wherein:
    the low-voltage components of the level shifter include input transistors and protection transistors coupled to the input transistors;
    gates of the protection transistors are biased to protect the low-voltage components of the level shifter;
    the driver circuit includes a high-voltage p-channel transistor, a first resistor, a second resistor, and a high-voltage n-channel transistor, which are connected in series between a power supply terminal of the high-speed circuit and a power ground terminal of the high-speed circuit;
    the power supply terminal is connected to a source terminal of the high-voltage p-channel transistor, a drain terminal of the high-voltage p-channel transistor is connected to a drain terminal of the high-voltage n-channel transistor via the first resistor and the second resistor, and a source terminal of the high-voltage n-channel transistor is connected to the power ground terminal;
    a connection terminal between the first resistor and the second resistor is an output terminal of the driver circuit; and
    a first control signal and a second control signal generated by the level shifter are coupled to a gate of the high-voltage p-channel transistor and a gate of the high-voltage n-channel transistor, respectively.

2. The high-speed circuit as claimed in claim 1, further comprising:
    a protection voltage generator, converting a power supply voltage and a power ground voltage to generate a first direct-current bias voltage and a second direct-current bias voltage;
    wherein gates of the protection transistors are coupled to the first direct-current bias voltage or the second direct-current bias voltage.

3. The high-speed circuit as claimed in claim 2, wherein:
    the protection voltage generator is an on-chip circuit having input terminals coupled to the power supply terminal and the power ground terminal of the high-speed circuit to receive the power supply voltage and the power ground voltage, respectively; and
    a first voltage difference between the power supply voltage and the first direct-current bias voltage and a second voltage difference between the second direct-current bias voltage and the power ground voltage are both within the low-voltage domain.

4. The high-speed circuit as claimed in claim 2, wherein:
    gate voltages of the protection transistors are tied to the first direct-current bias voltage or the second direct-current bias voltage.

5. The high-speed circuit as claimed in claim 2, wherein:
    the protection voltage generator is a low dropout regulator.

6. The high-speed circuit as claimed in claim 5, wherein:
    the low dropout regulator includes low-voltage components with thin gates.

7. The high-speed circuit as claimed in claim 1, further comprising:
    a pre-driver, including high-voltage components with thick gates and having power terminals coupled to the power supply terminal and the power ground terminal; and
    through the pre-driver, the first control signal and the second control signal generated by the level shifter are coupled to the gate of the high-voltage p-channel transistor and the gate of the high-voltage n-channel transistor, respectively.

8. The high-speed circuit as claimed in claim 1, wherein:
    the level shifter includes a first sub-circuit and a second sub-circuit outputting the first control signal and the second control signal, respectively;
    each of the first and second sub-circuits includes a low-voltage current mirror, a low-voltage input pair, and a low-voltage protection circuit;
    the low-voltage current mirror is coupled to the power supply terminal;
    the low-voltage protection circuit uses the protection transistors and is coupled between the low-voltage current mirror and the low-voltage input pair; and
    the first control signal or the second control signal is retrieved from a connection terminal between an output terminal of the low-voltage current mirror and the low-voltage protection circuit.

9. The high-speed circuit as claimed in claim 1, wherein:
the level shifter includes a first sub-circuit and a second sub-circuit outputting the first control signal and the second control signal, respectively;
each of the first and second sub-circuits includes a low-voltage current mirror, a low-voltage input pair, a low-voltage p-channel transistor, a first low-voltage n-channel transistor, and a second low-voltage n-channel transistor;
the low-voltage current mirror is coupled to the power supply terminal, and has a first terminal coupled to a drain terminal of the first low-voltage n-channel transistor and a second terminal coupled to a source terminal of the low-voltage p-channel transistor;
a source terminal of the first low-voltage n-channel transistor is coupled to a drain terminal of a positive transistor of the low-voltage input pair;
the second low-voltage n-channel transistor has a drain terminal coupled to a drain terminal of the low-voltage p-channel transistor and a source terminal coupled to a drain terminal of a negative transistor of the low-voltage input pair;
a gate of the low-voltage p-channel transistor is coupled to the first direct-current bias voltage;
gates of the first and second low-voltage n-channel transistors are coupled to the second direct-current bias voltage; and
the first control signal or the second control signal is retrieved from a connection terminal between the low-voltage p-channel transistor and the second low-voltage n-channel transistor.

10. The high-speed circuit as claimed in claim 1, wherein:
the level shifter includes a first sub-circuit and a second sub-circuit outputting the first control signal and the second control signal, respectively;
each of the first and second sub-circuits includes a low-voltage cross-coupled pair, a low-voltage input pair, and a low-voltage protection circuit;
the low-voltage cross-coupled pair is coupled to the power supply terminal;
the low-voltage protection circuit uses the protection transistors and is coupled between the low-voltage cross-coupled pair and the low-voltage input pair; and
the first control signal or the second control signal is retrieved from a connection terminal between the low-voltage cross-coupled pair and the low-voltage protection circuit.

11. The high-speed circuit as claimed in claim 1, wherein:
the level shifter includes a first sub-circuit and a second sub-circuit outputting the first control signal and the second control signal, respectively;
each of the first and second sub-circuits includes a high-voltage current mirror, a low-voltage input pair, and a low-voltage protection circuit;
the high-voltage current mirror is coupled to the power supply terminal;
the low-voltage protection circuit uses the protection transistors and is coupled between the high-voltage current mirror and the low-voltage input pair; and
the first control signal or the second control signal is retrieved from a connection terminal between an output terminal of the high-voltage current mirror and the low-voltage protection circuit.

12. The high-speed circuit as claimed in claim 1, wherein:
the level shifter includes a first sub-circuit and a second sub-circuit outputting the first control signal and the second control signal, respectively;
each of the first and second sub-circuits includes a high-voltage cross-coupled pair, a low-voltage input pair, and a low-voltage protection circuit;
the high-voltage cross-coupled pair is coupled to the power supply terminal;
the low-voltage protection circuit uses the protection transistors and is coupled between the high-voltage cross-coupled pair and the low-voltage input pair; and
the first control signal or the second control signal is retrieved from a connection terminal between the high-voltage cross-coupled pair and the low-voltage protection circuit.

13. The high-speed circuit as claimed in claim 1, wherein:
the high-speed circuit is provided to drive a memory module; and
the driver circuit has an input and output pin to be coupled to the memory module.

14. The high-speed circuit as claimed in claim 1, wherein:
the high-speed circuit is a transmitter circuit; and
the driver circuit drives an output pin of the transmitter circuit.

* * * * *